May 31, 1966 T. FALK 3,254,307

SIGNAL CHANNEL RANGE CHANGE CIRCUIT

Filed April 12, 1963 2 Sheets-Sheet 1

INVENTOR.
THOMAS FALK

BY Joseph Levinson

ATTORNEY

SIGNAL CHANNEL RANGE CHANGE CIRCUIT

Filed April 12, 1963 2 Sheets-Sheet 2

INVENTOR.
THOMAS FALK

BY Joseph Levinson

ATTORNEY

United States Patent Office 3,254,307

Patented May 31, 1966

3,254,307
SIGNAL CHANNEL RANGE CHANGE CIRCUIT

Thomas Falk, Norwalk, Conn., assignor to Barnes Engineering Company, Stamford, Conn., a corporation of Delaware Filed Apr. 12, 1963, Ser. No. 272,790
5 Claims. (Cl. 330—28)

Figure 1:
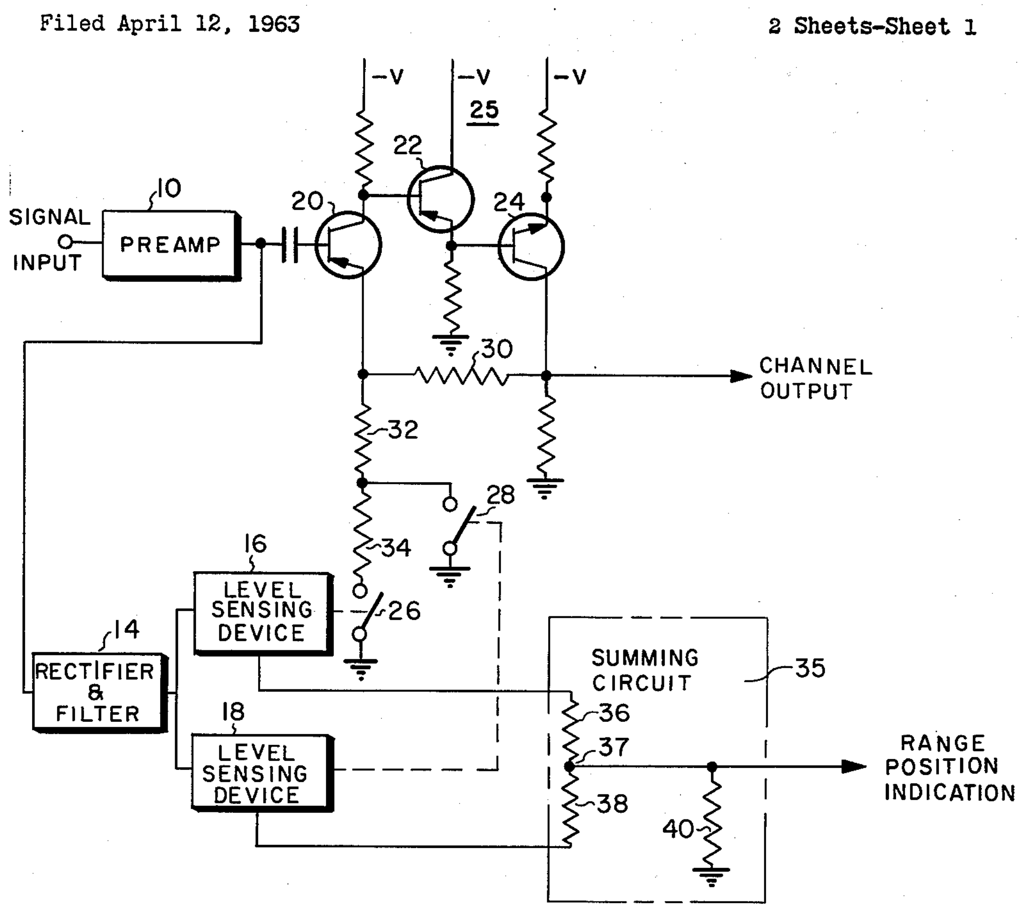

The invention described herein may be manufactured and used by or for the Government of the United States for governmental purposes without the payment to me of any royalty thereon.

This invention relates to an automatic gain control circuit and more particularly to a signal channel range changing circuit for improving resolution of a signal channel subjected to widely varying signal levels.

In many electronic applications, a wide range of signal levels is encountered which are preferably handled by a single signal channel. It is desirable to provide a linear signal transfer in the signal channel such that, as the amplitude of the incoming signal increases, the amplitude of the output signal from the signal channel increases in a linear fashion so that the wave shape of the incoming signal may be amplified without distortion. Without such a linear transfer, distortion is introduced. In some instances the problem may be solved by utilizing logarithmic amplifiers for covering an extending range of signals. However, distortion is introduced by the logarithmic amplifiers which is not desirable for many applications. It would also be desirable to provide good resolution for weak signals as well as strong signals, to provide more useful information to utilization means such as recorders, meters, telemetry systems, etc.

Accordingly, it is an object of this invention to provide a new and improved signal processing channel which provides a linear transfer characteristic over a wide range of signal levels.

A further object of this invention is to provide a new and improved signal channel range changing circuit having improved resolution for a wide range of signal levels.

Another object of this invention is to provide a new and improved range changing circuit which passes an extended range of signals without distortion.

Still another object of this invention is to provide a new and improved range changing circuit which provides a change in linear gain from one linear slope to another linear slope for different signal levels and simultaneously provides an indication of the signal range being processed by the range changing circuit.

In carrying out this invention in one illustrative embodiment thereof, a signal channel is provided with a range changing circuit which includes a variable feedback means. Level sensing means are provided for determining the amplitude of incoming signals, and are adapted for actuating switch means in response to a predetermined amplitude of the incoming signal for applying varying amounts of feedback in stepwise fashion to the signal channel. Accordingly, a plurality of ranges are provided which span the range of signals to be processed by the signal channel so that the signal channel offers a linear transfer characteristic for a full range of signal input, thereby improving the resolution for different signal levels. An indicating circuit is also associated with the level sensing means for providing an indication of which range the signal channel is operating.

Figure 2:
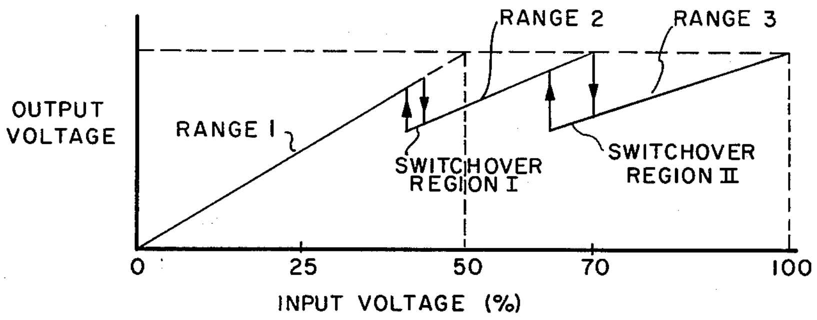
Figure 3:
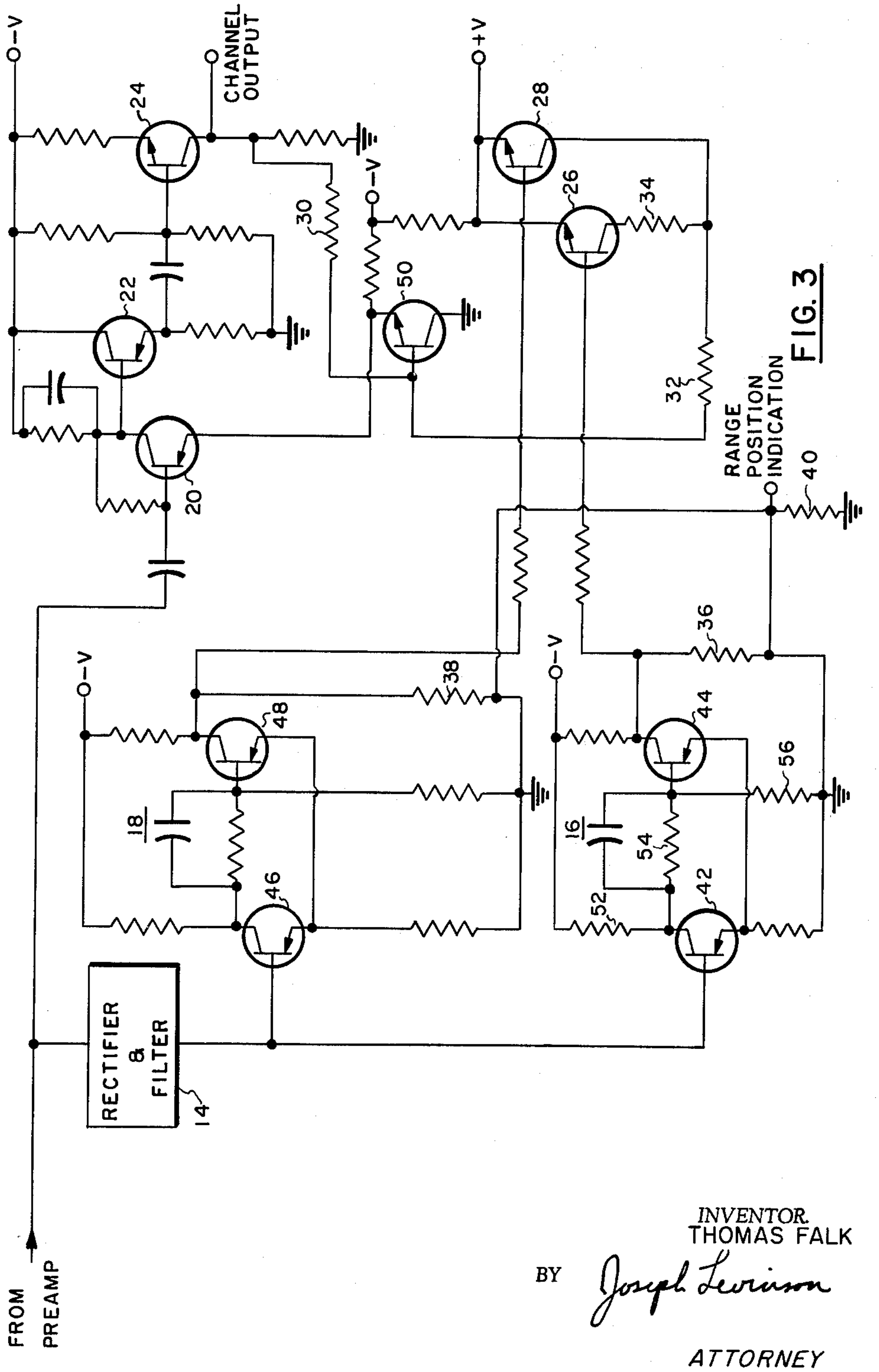

The invention, both as to organization and method of operation, together with further objects and advantages thereof, may best be understood by reference to the following description, taken in connection with the accompanying drawings, in which:

FIG. 1 is a schematic diagram, partly in block form, of the signal channel range change circuit embodied in this invention, FIG. 2 is a graph of output versus input, representing the gain characteristics achieved by the circuit of FIG. 1; and FIG. 3 is a schematic diagram of one form of the range changing circuit shown in FIG. 1.

Referring now to FIG. 1, a sinusoidal input signal, which may vary greatly in amplitude, is applied to a preamplifier 10 and then to a range changing circuit referred generally with the reference character 25. The range changing circuit 25 includes a transistor 20, a transistor 22 connected as an emitter follower, and a transistor 24. The output of the transistor 24 is shown taken from the collector electrode of the transistor 24. Depending on the phase of the output signal desired, the output signal might also be taken from the emitter electrode of the transistor 24. A feedback path is provided by a resistance 30 connected between the collector electrode of transistor 24 and the emitter electrode of transistor 20. A resistor 32 and a resistor 34 may be serially connected between the emitter electrode of transistor 20 and ground by a switch 26, or the resistor 32 may be connected between ground and the emitter electrode of transistor 20 by a switch 28. The resistors 30, 32 and 34 form a voltage divider network which provides a variable amount of feedback in stepwise fashion, depending on the switch positions of switches 26 and 28. Accordingly, the gain of the range change circuit 25 is controlled by the amount of feedback applied from the transistor 24 to the transistor 20. The gain of the range change circuit is increased by feeding back less signal.

The amplified sinusoidal input signal is also applied to a rectifier and filter 14 for converting the signal from an A.C. to a D.C. signal. The D.C. signal is applied to a pair of level sensing devices 16 and 18. When the input signal reaches a predetermined amplitude, level sensing device 18 is actuated, which opens normally closed switch 28, thereby increasing the resistance between the emitter electrode of transistor 20 and ground through closed switch 26. Since a greater portion of the signal is thus fed back between the collector electrode of transistor 24 and the emitter electrode of transistor 20, the gain of the range change circuit is thereby reduced. As the amplitude of the input signal continues to increase to a level sufficient to activate level sensing device 16, the switch 26 is thereby opened. With both switches 26 and 28 open, the resistances of resistors 32 and 34 are removed from the feedback path, resulting in maximum feedback with another reduction in gain.

FIG. 2 shows graphically the range changes which take place due to the operation of the level sensing devices 16 and 18 which are responsive to the amplitude of the input signal. Range 1 on FIG. 2 occurs when switches 26 and 28 are closed to produce maximum gain, which is desirable at low input signal levels. Intermediate range 2 is provided when switch 28 is open while switch 26 is closed, and range 3 is provided when both switches 26 and 28 are open, thereby providing the least amount of gain in the range of the largest input signals. It will be observed that this range change circuit provides a linear change in gain over a wide range of input signals by switching from one linear slope to another in progression as the signal level increases, or vice versa. The range of signal levels of the signal channel is expanded to provide improved resolution at different signal levels. By providing a linear transfer of signals, sinusoidal inputs appear as sinusoidal outputs without distortion over the expanded range. Switchover regions 1 and 2 are desirably of a hysteresis configuration so as not to permit frequent range changes for small fluctuations in the value of the input signal close to the switchover threshold. Such characteristics may be obtained by properly designing level sensing devices 16 and 18 in conjunction with their switching arrangements.

In order to quickly identify the range in which the signal channel is functioning, a summing circuit 35 is provided. It includes a voltage divider 37 having a resistor 36 connected to level sensing device 16, and a resistor 38 connected to level sensing device 18. A resistor 40 is connected between the junction of resistors 36 and 38 and ground to provide a signal indicative of the range position in which the signal channel is operating.

A preferred circuit for carrying out the invention described in connection with FIGS. 1 and 2 is shown in FIG. 3 in which, wherever practical, the same reference characters are utilized for representing the same elements of FIG. 1. In the embodiment of FIG. 3 the level sensing devices 16 and 18 are Schmitt triggers. Schmitt trigger 18 includes transistors 46 and 48, and Schmitt trigger 16 includes transistors 42 and 44. The switches 26 and 28 are transistors, and a continually conducting transistor 50 of the emitter follower configuration is interposed in the emitter circuit of the transistor 20. The Schmitt triggers 16 and 18 are regenerative bistable circuits having operating characteristics which depend on the amplitude of the input voltage. In explaining the operation, for example, of Schmitt trigger 16, and assuming that transistor 42 is non-conductive because the signal level from rectifier filter 14 is not sufficiently negative to cause conduction thereof, the base collector junction of transistor 44 is biased into conduction by the voltage provided from a voltage divider comprised of resistors 52, 54 and 56. The emitters of transistors 42 and 44 are biased at a lower level due to the forward bias voltage required for transistor 44. As the input voltage to the base of transistor 42 approaches the bias level on the emitter electrode of transistor 42, a critical voltage level is reached where transistor 42 begins to conduct which regeneratively turns off transistor 44. If the input voltage to the base of transistor 42 is again lowered below another critical value which depends upon the biasing arrangement for the Schmitt trigger, transistor 44 again begins conducting while transistor 42 becomes non-conducting. It should be noted that the conduction of transistors 44 and 48 cause conduction of transistors 26 and 28, respectively. The conduction of transistors 26 and 28 correspond to a closed switch condition as described in connection with the circuit of FIG. 1.

In the operation of the circuit of FIG. 3, assuming signal levels corresponding to range 1 on FIG. 2, transistor 44 of Schmitt trigger 16 is conductive, and transistor 48 of Schmitt trigger 18 is conductive. Correspondingly, transistor 26, which is connected to the output of transistor 44, is conductive, and transistor 28, which is connected to the output of transistor 48, is also conductive. The conduction of transistors 26 and 28 operates to connect resistor 32 in series with resistor 30 in a voltage divider arrangement, the junction of which is connected through transistor 50 to the emitter electrode of transistor 20, thereby providing the least amount of feedback and increasing the gain for range 1, whose input signal amplitude is low. When the amplitude of the incoming signal increases sufficiently to cause transistor 46 to conduct, the range change circuit shifts from range 1 to range 2. Transistor 48 stops conducting, as does its associated switch 28. Since transistor 26 is still conducting, resistors 34 and 32 are serially connected in series with resistor 30, with the junction of resistors 30 and 32 being connected through transistor 50 to the emitter electrode of transistor 20, which decreases the gain by increasing the feedback to transistor 20. With still increasingly higher input signal levels, transistor 42 is driven into conduction, thereby cutting off transistor 44 and its associated switching transistor 26, which shifts the range change circuit to range 3, as shown on FIG. 2. In this instance, resistance 30 is connected between the collector electrode of transistor 24 through the base emitter path of transistor 50 to the emitter electrode of transistor 20, which provides the greatest amount of feedback and reduces the gain further. This is desirable for large amplitude signals corresponding to those in range 3. As the signal levels decrease, the reverse takes place.

In determining the operating levels of the Schmitt triggers 16 and 18, it is desirable to produce the hysteresis characteristic in the switchover regions as is shown on FIG. 2. These hysteresis characteristics should be sufficiently wide to prevent frequent range changes for small fluctuations in the value of input signals close to the switchover thresholds. The switchover level should occur such that little use is made of the low signal end of the medium and high level ranges, in order that signals corresponding to these areas are measured on the next higher sensitivity range, thereby offering better resolution. Furthermore, the switchover levels should be far enough from the range edges so that variations in trigger characteristics with temperature still allow a reasonable overlap between ranges, so that no gaps will exist for the entire expanded range of operation of the signal channel.

It will be appreciated that trigger circuits other than Schmitt triggers might be used, for example, the Merlen trigger as disclosed in an application Serial No. 73,395, now Patent No. 3,109,943, could be used in applications where more narrow switchover regions are desirable.

The signal channel range change circuit as embodied in this invention provides improved resolution for a wide range of signal levels. A linear signal transfer is provided for an extended range of signals without introducing distortion. Such an arrangement is suitable for a wide variety of applications for signal channels which are subjected to wide changes in signal levels.

Since other modifications, varied to fit particular operating requirements and environments, will be apparent to those skilled in the art, the invention is not considered limited to the examples chosen for purposes of disclosure, and covers all changes and modifications which do not constitute departures from the true spirit and scope of this invention.

What I claim as new and desire to secure by Letters Patent is:

1. A signal channel range changing circuit comprising (a) a signal amplifying channel having an input and an output, (b) means for applying a variable amplitude input signal to the input of said amplifying channel, (c) a feedback path connected between said output and said input having a variable feedback means comprising a first resistor which is serially connected in said feedback path between said output and said input, and at least one other resistor which is connected in shunt with said first resistor and is adapted to be switched out of said feedback path in acordance with a predetermined amplitude of said input signal for controlling the amount of feedback in said feedback path, (d) at least one switch means coupled to said other resistor for disconnecting said other resistor from said first resistor in said feedback path when said switch means is actuated, (e) at least one level sensing device coupled between said input and said switch means for actuating said switch means in response to a predetermined amplitude of said input signal for disconnecting said other resistor from said feedback path to increase the feedback as long as said switch is actuated, whereby more feedback is applied for higher amplitude input signals to expand the range of signals which may be handled in a linear fashion by said amplifying channel.

2. The circuit set forth in claim 1 wherein a plurality of switch means, a plurality of level sensing devices, and a plurality of resistors which are connected in shunt with said first resistor are provided, each level sensing device actuating a different associated switch means at a different predetermined amplitude level for disconnecting an associated resistor from said feedback path, thereby controlling the amount of feedback in said path in accordance with the amplitude of said input signal.

3. The circuit set forth in claim 1 wherein said level sensing device is a trigger circuit having a hysteresis operating characteristic in order to prevent range changes for small fluctuations in signal amplitude close to the predetermined amplitude operating level of said level sensing device.

4. The circuit set forth in claim 2 wherein said level sensing devices are trigger circuits having hysteresis operating characteristics in order to prevent range changes for small fluctuations in signal amplitude close to the predetermined amplitude operating level of any of said level sensing devices.

5. The circuit set forth in claim 2 which includes a summing circuit comprising resistors connected to the outputs of said trigger circuits and to a summing junction for providing a range position indication for said amplifying channel at said summing junction.

References Cited by the Examiner

UNITED STATES PATENTS

| | | | |
|---|---|---|---|
| 2,480,195 | 8/1949 | Posthumus | 330—96 |
| 2,930,987 | 3/1960 | Groce et al. | 330—145 X |
| 2,935,697 | 5/1960 | McManis | 330—145 |
| 3,106,646 | 10/1963 | Carter | 325—319 X |
| 3,106,684 | 10/1963 | Luik | 330—86 X |
| 3,158,818 | 11/1964 | Plumpe | 330—29 |

ROY LAKE, *Primary Examiner.*

R. P. KANANEN, *Assistant Examiner.*